United States Patent
Yeong et al.

(10) Patent No.: US 12,131,943 B2
(45) Date of Patent: Oct. 29, 2024

(54) SEMICONDUCTOR STRUCTURE HAVING EPITAXIAL STRUCTURE

(71) Applicant: TAIWAN SEMICONDUCTOR MANUFACTURING COMPANY, LTD., Hsinchu (TW)

(72) Inventors: Sai-Hooi Yeong, Zhubei (TW); Yen-Chieh Huang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/359,412

(22) Filed: Jul. 26, 2023

(65) Prior Publication Data

US 2024/0021465 A1    Jan. 18, 2024

Related U.S. Application Data

(60) Continuation of application No. 17/345,327, filed on Jun. 11, 2021, now Pat. No. 11,756,824, which is a division of application No. 16/427,088, filed on May 30, 2019, now Pat. No. 11,037,818.

(51) Int. Cl.
*H01L 29/66* (2006.01)
*H01L 21/764* (2006.01)
*H01L 29/06* (2006.01)
*H01L 29/08* (2006.01)
*H01L 29/78* (2006.01)

(52) U.S. Cl.
CPC ........ *H01L 21/764* (2013.01); *H01L 29/0649* (2013.01); *H01L 29/0847* (2013.01); *H01L 29/6653* (2013.01); *H01L 29/6656* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | |
|---|---|---|
| 9,159,630 B1 | 10/2015 | Wei et al. |
| 9,716,096 B1 | 7/2017 | Ching et al. |
| 10,163,635 B1 | 12/2018 | Qi et al. |
| 10,269,932 B1 | 4/2019 | Arya et al. |
| 2016/0315081 A1* | 10/2016 | Park .................. H01L 29/41791 |
| 2017/0098648 A1 | 4/2017 | Lee et al. |
| 2017/0133286 A1* | 5/2017 | Sung ............... H01L 21/823821 |
| 2017/0323954 A1 | 11/2017 | Tsai et al. |
| 2018/0033626 A1 | 2/2018 | Liao et al. |
| 2018/0151439 A1 | 5/2018 | Huang |
| 2019/0148551 A1 | 5/2019 | More et al. |

* cited by examiner

*Primary Examiner* — Benjamin P Sandvik

(74) *Attorney, Agent, or Firm* — Birch, Stewart, Kolasch & Birch, LLP

(57) ABSTRACT

A semiconductor structure is provided. The semiconductor structure includes a first fin and a second fin on a semiconductor substrate. The semiconductor structure also includes an epitaxial structure on the first fin and the second fin. The semiconductor structure further includes outer spacers on outer sidewalls of the epitaxial structure. In addition, the semiconductor structure includes an inner spacer structure between the first fin and the second fin and covering inner sidewalls of the epitaxial structure. A top surface of the inner spacer structure is exposed to an air gap formed between the epitaxial structure and the inner spacer structure.

20 Claims, 15 Drawing Sheets

SEMICONDUCTOR STRUCTURE HAVING EPITAXIAL STRUCTURE

CROSS REFERENCE TO RELATED APPLICATIONS

This application is a Continuation Application of U.S. patent application Ser. No. 17/345,327, filed Jun. 11, 2021, and entitled "SEMICONDUCTOR STRUCTURE HAVING EPITAXIAL STRUCTURE", which is a Division of pending U.S. patent application Ser. No. 16/427,088, filed May 30, 2019 and entitled "SEMICONDUCTOR STRUCTURE HAVING EPITAXIAL STRUCTURE AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
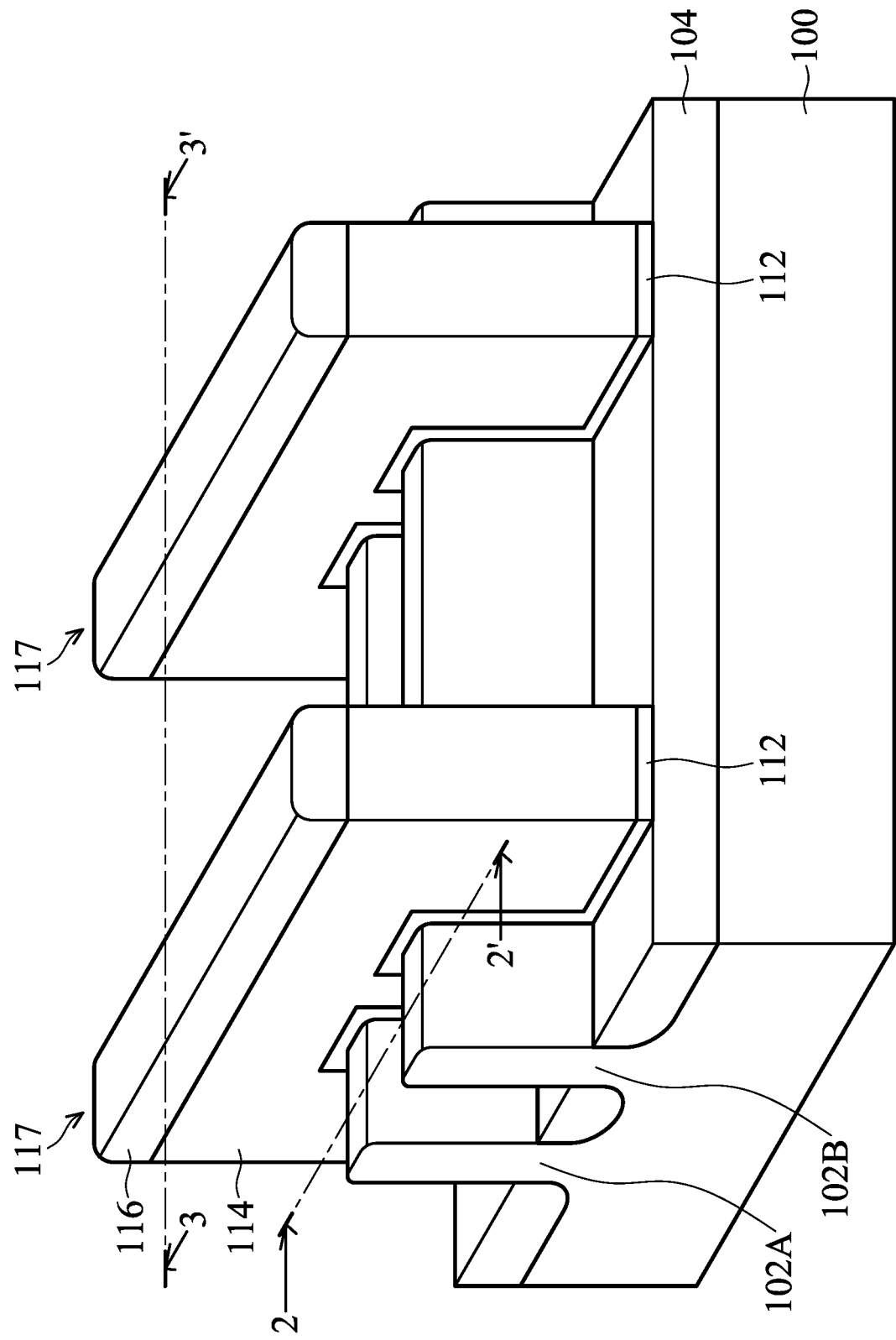
FIG. 1 is a perspective view of a stage of a process for forming a semiconductor structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of the disclosure may relate to a FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments for forming a semiconductor structure are provided. The method for forming the semiconductor structure may include forming a first fin and a second fin on a semiconductor substrate, and forming a first dielectric material over the first fin and the second fin. A second dielectric material may be formed over the first dielectric material and above an interspace between the first fin and the second fin. In addition, the first dielectric material and the second dielectric material may be partially removed to form an inner spacer structure between the first fin and the second fin and outer spacers on two opposite sides of the inner spacer structure. An epitaxial structure may be formed on the first fin and the second fin. The top surface of the inner spacer structure may be below the top surfaces of the outer spacers, such that the growth of the epitaxial structure outwards along lateral directions can be better restrained and confined by the relatively high outer spacers. Therefore, the lateral growth of the epitaxial structure can be reduced, and the parasitic capacitance can be reduced. Moreover, the merge window of growths of adjacent epitaxial structures can be enlarged due to the reduced lateral growth of the epitaxial structures.

FIG. 1 is a perspective view of a stage of a process for forming a semiconductor structure 10, in accordance with some embodiments. FIGS. 2A-2H are cross-sectional views along the cross-sectional line 2-2' of FIG. 1 of various stages of a process for forming the semiconductor structure 10, in accordance with some embodiments. FIGS. 3A-3H are cross-sectional views along the cross-sectional line 3-3' of FIG. 1 of various stages of a process for forming the semiconductor structure 10, in accordance with some embodiments.

A semiconductor substrate 100 is provided as shown in FIG. 1, in accordance with some embodiments. In some embodiments, the semiconductor substrate 100 is a bulk semiconductor substrate, such as a semiconductor wafer. For example, the semiconductor substrate 100 includes silicon or other elementary semiconductor materials such as germanium. In some embodiments, the semiconductor substrate 100 is un-doped or doped (e.g., p-type, n-type, or a combination thereof).

In some embodiments, the semiconductor substrate 100 includes a compound semiconductor. The compound semiconductor may include silicon carbide, gallium arsenide, gallium phosphide, indium arsenide, indium phosphide, indium antimonide, one or more other applicable compound semiconductors, or a combination thereof.

In some embodiments, the semiconductor substrate 100 includes an alloy semiconductor. The alloy semiconductor may include silicon germanium (SiGe), GaAsP, AlInAs, AlGaAs, GaInAs, GaInP, GaInAsP, one or more other applicable alloy semiconductors, or a combination thereof.

In some embodiments, the semiconductor substrate 100 is an active layer of a semiconductor-on-insulator substrate, such as a silicon-on-insulator (SOI) substrate, a silicon germanium-on-insulator (SGOI) substrate, or a germanium-on-insulator (GOI) substrate. The semiconductor-on-insulator substrate may be fabricated using a separation by implantation of oxygen (SIMOX) process, a wafer bonding process, one or more other applicable methods, or a combination thereof. In some embodiments, the semiconductor substrate 100 includes a multi-layered structure. For example, the semiconductor substrate 100 includes a bulk silicon layer and a silicon-germanium layer formed on the bulk silicon layer.

Recesses (or trenches) are formed in the semiconductor substrate 100 as shown in FIG. 1, in accordance with some embodiments. Therefore, fins are formed on the semiconductor substrate 100 and defined between the recesses. Two of the fins (fins 102A and 102B) are formed on the semiconductor substrate 100, as shown in FIG. 1, in accordance with some embodiments. In some embodiments, one or more photolithography and etching processes are used to form the recesses. In some embodiments, the fins 102A and 102B are in direct contact with the semiconductor substrate 100. The fins 102A and 102B may include the same material as that of the semiconductor substrate 100.

However, embodiments of the disclosure have many variations and/or modifications. In some other embodiments, the fins 102A and 102B are not in direct contact with the semiconductor substrate 100. One or more other material layers may be formed between the semiconductor substrate 100 and the fins 102A and 102B. A dielectric layer may be formed between the semiconductor substrate 100 and the fins 102A and 102B.

An isolation feature 104 is formed in the recesses to surround lower portions of the fins 102A and 102B as shown in FIG. 1, in accordance with some embodiments. The isolation feature 104 may be used to define and electrically isolate various device elements formed in and/or over the semiconductor substrate 100. In some embodiments, the isolation feature 104 is made of a dielectric material. The dielectric material may include silicon oxide, silicon nitride, silicon oxynitride, fluoride-doped silicate glass (FSG), low-K dielectric material, one or more other applicable materials, or a combination thereof.

In some embodiments, a dielectric material layer is deposited over the semiconductor substrate 100. The dielectric material layer covers the fins 102A and 102B and fills the recesses between the fins 102A and 102B. The dielectric material layer may be deposited using a chemical vapor deposition (CVD) process, an atomic layer deposition (ALD) process, a physical vapor deposition (PVD) process, a spin-on process, one or more other applicable processes, or a combination thereof. A planarization process may then be used to thin down the dielectric material layer until the fins 102A and 102B or hard mask elements defining the fins 102A and 102B are exposed. The planarization process may include a chemical mechanical polishing (CMP) process, a grinding process, a dry polishing process, an etching process, one or more other applicable processes, or a combination thereof. Afterwards, the dielectric material layer may be etched back such that the fins 102A and 102B protrude from the top surface of the remaining dielectric material layer after the etching process. Therefore, the remaining portions of the dielectric material layer form the isolation feature 104 as shown in FIG. 1, in accordance with some embodiments.

In some embodiments, the isolation feature 104 includes shallow trench isolation (STI) features, deep trench isolation (DTI) structures, local oxidation of silicon (LOCOS) features, one or more other applicable isolation features, or a combination thereof. In some embodiments, the isolation feature 104 has a multi-layer structure. In some embodiments, an STI liner (not shown) is formed to reduce crystalline defects at the interface between the semiconductor substrate 100 and the isolation feature 104. Similarly, the STI liner may also be used to reduce crystalline defects at the interface between the isolation feature 104 and the fins 102A and 102B.

Afterwards, gate structures 117 are formed over the fins 102A and 102B and the semiconductor substrate 100, as shown in FIG. 1, in accordance with some embodiments. In some embodiments, the gate structures 117 partially cover the fins 102A and 102B, as shown in FIG. 1. Each of the gate structures 117 includes a gate dielectric layer 112, a gate electrode layer 114, and a hard mask layer 116, as shown in FIG. 1, in accordance with some embodiments. The gate structure 117 may include additional layers such as a capping layer, a diffusion/barrier layer, a dielectric layer, a conductive layer, an interfacial layer (IL), other applicable layers, and/or a combination thereof.

In some embodiments, the gate dielectric layer 112 is formed over the isolation feature 104 and the fins 102A and 102B and includes a dielectric material, such as silicon oxide, silicon nitride, silicon oxynitride, a high-k dielectric material, one or more other applicable dielectric materials, and/or a combination thereof. The high-k dielectric material may include $HfO_2$, HfSiO, HfSiON, HfTaO, HfTiO, HfZrO, zirconium oxide ($ZrO_2$), aluminum oxide ($Al_2O_3$), hafnium dioxide-alumina ($HfO_2$—$Al_2O_3$) alloy, one or more other applicable high-k dielectric materials, and/or a combination thereof.

In some embodiments, the gate electrode layer 114 is formed over the gate dielectric layer 112. The gate electrode layer 114 may include polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, one or more other applicable materials, and/or a combination thereof.

In some embodiments, the hard mask layer 116 is formed over the gate electrode layer 114. The hard mask layer 116 may include any applicable material, for example, silicon nitride, silicon oxynitride, silicon carbide, silicon oxycarbide, spin-on glass (SOG), a low-k film, plasma enhanced CVD oxide (PE-oxide), high-aspect-ratio-process (HARP) formed oxide, one or more other applicable materials, and/or a combination thereof.

Each material layer of the gate structure 117 may be formed by any applicable process. Each material layer may be formed by a deposition process, a photolithography patterning process, and an etching process. The deposition process may include CVD, PVD, ALD, HDP-CVD, metal organic CVD (MO-CVD), remote plasma CVD (RP-CVD), plasma enhanced CVD (PE-CVD), plating, one or more other applicable deposition processes, and/or a combination thereof. The photolithography patterning process may include photoresist coating (e.g., spin-on coating), soft baking, mask aligning, exposure, post-exposure baking, developing the photoresist, rinsing, drying (e.g., hard baking), one or more other applicable processes, and/or a combination thereof. The etching process may include dry etching, wet etching, and/or a combination thereof.

In some embodiments, the gate structures 117 are dummy gate structures, and portions of the gate structures 117 are subsequently replaced with high-k/metal gate (MG) structures after high thermal budget processes are performed.

Figure 2A:
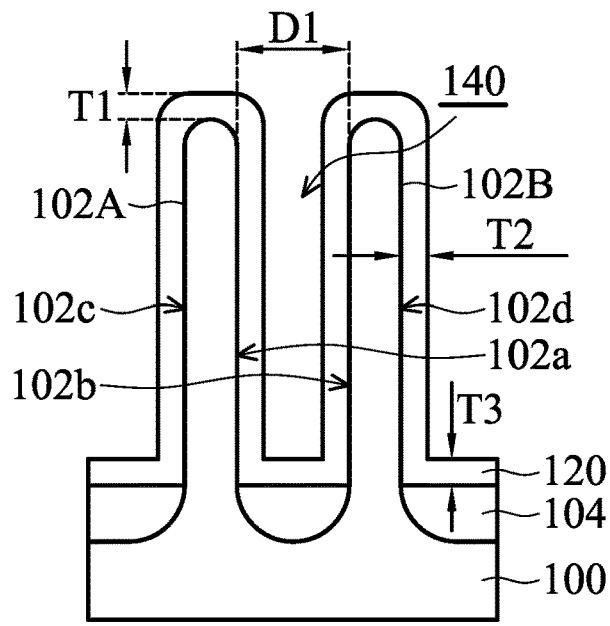
FIGS. 2A-2H are cross-sectional views of various stages of a process for forming a semiconductor structure, in accordance with some embodiments.
Figure 3A:
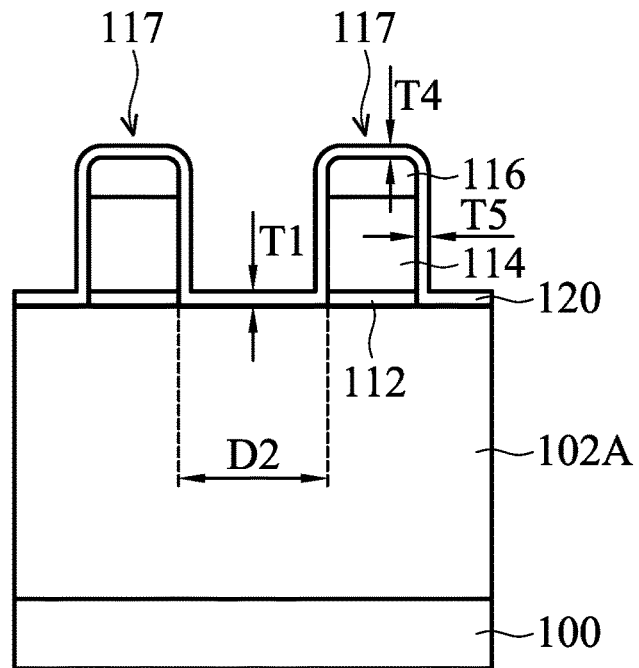
FIGS. 3A-3H are cross-sectional views of various stages of a process for forming a semiconductor structure, in accordance with some embodiments.

The fin 102A and the fin 102B are separated by a distance D1, and the two adjacent gate structures 117 are separated by a distance D2. In some embodiments, the distance D1 is smaller than the distance D2, as shown in FIG. 1 and FIGS. 2A and 3A. In some embodiments, the ratio (D2/D1) of the distance D2 to the distance D1 is about greater than 1. In some embodiments, the ratio (D2/D1) of the distance D2 to the distance D1 is in a range from about 1.2 to about 5. In some embodiments, the distance D1 between the fin 102A and the fin 102B is in a range from about 8 nm to about 30 nm. In some embodiments, the distance D2 between the adjacent gate structures 117 is about greater than 30 nm.

Afterwards, a dielectric material 120 is formed over the fins 102A and 102B and the gate structures 117, as shown in FIGS. 2A and 3A, in accordance with some embodiments. The dielectric material 120 may be made of silicon nitride, silicon oxide, silicon oxynitride, silicon oxycarbide, silicon carbonitride, silicon oxycarbonitride, silicon oxycarbonitride doped with boron, borosilicate glass (BSG), phosphoric silicate glass (PSG), borophosphosilicate glass (BPSG), fluorinated silicate glass (FSG), a low-k material, a porous dielectric material, one or more other applicable dielectric materials, or a combination thereof. In some embodiments, the dielectric material 120 has a dielectric constant of about 3 to about 5. In some embodiments, the dielectric material 120 is deposited using a CVD process, a HDP-CVD process, an ALD process, a spin-on process, one or more other applicable processes, or a combination thereof.

The dielectric material 120 is formed conformally over the fins 102A and 102B, as shown in FIG. 2A, in accordance with some embodiments. In some embodiments, the dielectric material 120 is also formed over the gate structures 117, as shown in FIG. 3A. In some embodiments, the dielectric material 120 is formed conformally over the fins 102A and 102B, the isolation feature 104, the gate structures 117, and the exposed top surface 100a of the semiconductor substrate 100, as shown in FIGS. 2A and 3A. In some embodiments, the dielectric material 120 is formed conformally on the inner sidewall 102a of the fin 102A and the inner sidewall 102b of the fin 102B in the interspace 140 between the fin 102A and the fin 102B, as shown in FIG. 2A.

In some embodiments, the dielectric material 120 has a substantially uniform thickness. The dielectric material 120 has a thickness T1 on upper portions of the fins 102A and 102B, the dielectric material 120 has a thickness T2 on sidewalls of the fins 102A and 102B, and the dielectric material 120 has a thickness T3 on the isolation feature 104. In some embodiments, the ratio (T2/T1) of the thickness T2 to the thickness T1 is about 0.9 to about 1.1. In some embodiments, the ratio (T3/T2) of the thickness T3 to the thickness T2 is about 0.9 to about 1.1. The dielectric material 120 has a thickness T4 on upper portions of the gate structures 117, and the dielectric material 120 has a thickness T5 on sidewalls of the gate structures 117. In some embodiments, the ratio (T4/T1) of the thickness T4 to the thickness T1 is about 0.9 to about 1.1. In some embodiments, the ratio (T5/T1) of the thickness T5 to the thickness T4 is about 0.9 to about 1.1.

In some embodiments, the dielectric material 120 is formed on the fins 102A and 102B and in the interspace 140, and the thickness of the dielectric material 120 is less than half of the distance D1 between the fin 102A and the fin 102B. Thus, the space remained within the interspace 140 can be reduced due to the thickness of the dielectric material 120, yet the interspace 140 is not fully filled by the dielectric material 120. Therefore, another dielectric material can be formed over the dielectric material 120 and piled above the interspace 140 subsequently, while an air gap can still remain within the interspace 140 below the piled-up dielectric material. This is advantageous to the reduction of the parasitic capacitance of the semiconductor structure, and the details will be discussed hereinafter.

In some embodiments, the thickness (e.g., the thickness T1, the thickness T2, the thickness T3, the thickness T4, and/or the thickness T5) of the dielectric material 120 is about 3 nm to about 8 nm. In some embodiments, the distance between the dielectric material 120 on the inner sidewall 102a and the dielectric material 120 on the inner sidewall 102b is less than the distance D1 between the fin 102A and the fin 102B, as shown in FIG. 2A.

Figure 2B:
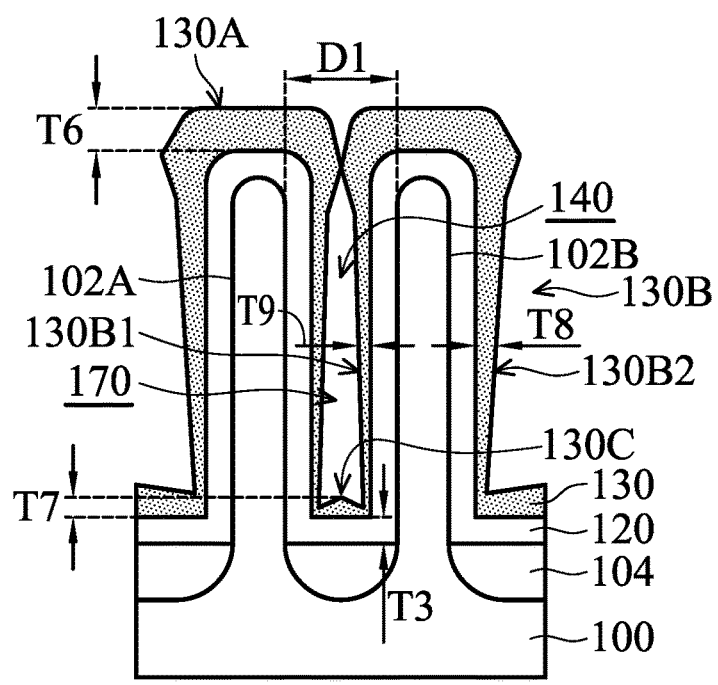
Figure 3B:
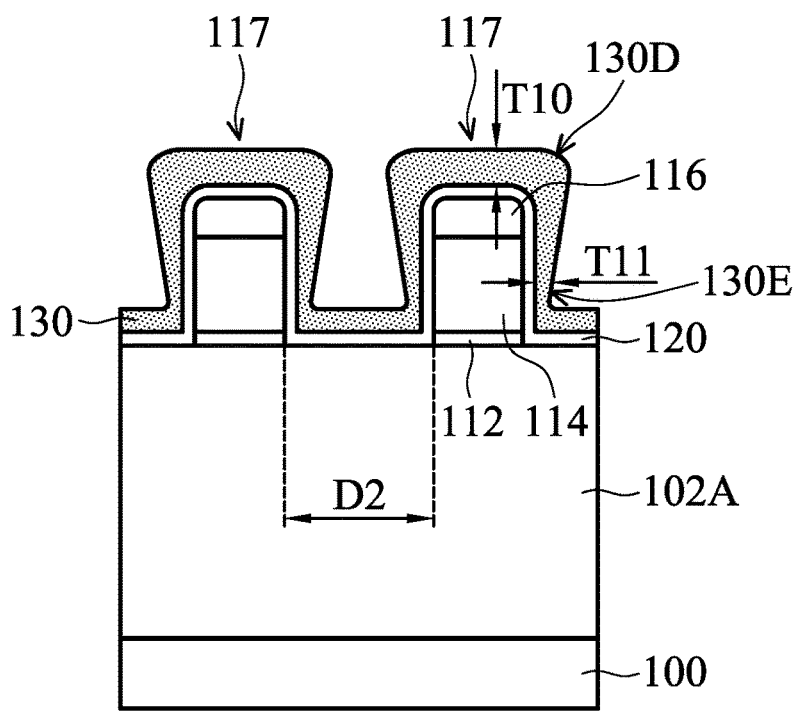

Afterwards, a dielectric material 130 is formed over the dielectric material 120 and above the interspace 140 between the fin 102A and the fin 102B, as shown in FIGS. 2B and 3B, in accordance with some embodiments. As described previously, in some embodiments, the space remained in the interspace 140 is reduced due to the thickness of the dielectric material 120 in the interspace 140. Therefore, during the initial stage of the formation of the dielectric material 130, the dielectric material 130 may easily extend laterally along the dielectric material 120 towards the interspace 140, and a portion of the dielectric material 130 may eventually pile up above the interspace 140. This portion of the dielectric material 130 located above the interspace 140 may result in different deposited amounts of the dielectric material 130 in the interspace 140 and outside the interspace 140, and the details will be discussed hereinafter.

In some embodiments, the dielectric material 130 is made of silicon nitride, silicon carbonitride, silicon oxynitride, one or more other applicable dielectric materials, or a combination thereof. In some embodiments, the dielectric material 130 has a dielectric constant of about 7 to about 8. In some embodiments, the dielectric constant of the dielectric material 130 is higher than the dielectric constant of the dielectric material 120.

In some embodiments, the dielectric material 130 is deposited using a physical vapor deposition (PVD) process. In some embodiments, the PVD process includes a vacuum evaporation process, a sputtering process, one or more other applicable processes, and/or a combination thereof. In some embodiments, the operation temperature of the PVD process is within a range of about 100 degrees C. to about 800 degrees C. In some embodiments, the operation pressure of the PVD process is within a range of about $3 \times 10^{-3}$ torr to about $5 \times 10^{-2}$ torr.

In some embodiments, the dielectric material 130 is formed by a physical vapor deposition. Thus, a portion of the dielectric material 130 may be deposited above the interspace 140 in the initial stage of the deposition of the dielectric material 130. This portion may block the deposition material of the dielectric material 130 from keeping further entering into the interspace 140 during the subsequent stage of the deposition. Thus, less deposition material of the dielectric material 130 may be allowed to enter into the interspace 140. Therefore, the deposited amount (e.g., the bottom portion 130C and the inner part 130B1) of the dielectric material 130 in the interspace 140 is less than the deposited amount (e.g., the top portion 130A and the outer part 130B2) of the dielectric material 130 outside the interspace 140, in accordance with some embodiments. The difference in deposited amounts may benefit the formation of an inner spacer structure and outer spacers having different heights in subsequent processes, and the details will be discussed hereinafter.

In some embodiments, the top portion 130A of the dielectric material 130 over the fins 102A and 102B is thicker than the bottom portion 130C of the dielectric material 130 between the fin 102A and the fin 102B, as shown in FIG. 2B. In some embodiments, the thickness T6 of the top portion 130A over the upper portions of the fins 102A and 102B is greater than the thickness T7 of the bottom portion 130C over the dielectric layer 120 in the interspace 140, as shown in FIG. 2B. In some embodiments, the ratio (T6/T7) of the thickness T6 to the thickness T7 is about greater than 1. In some embodiments, the ratio (T6/T7) of the thickness T6 to the thickness T7 is about 1.2 to about 5.

In some embodiments, the dielectric material 130 further has a side portion 130B formed on the sidewalls of the fins 102A and 102B. In some embodiments, the side portion 130B connects the top portion 130A to the bottom portion 130C. The side portion 130B has a thickness that substantially decreases from the top portion 130A towards the bottom portion 130C, as shown in FIG. 2B, in accordance with some embodiments. In some embodiments, the side portion 130B has an inner part 130B1 in the interspace 140 and an outer part 130B2 on outer sidewalls 102c and 102d of the fins 102A and 102B, as shown in FIG. 2B. In some embodiments, the inner part 130B1 is thinner than the outer part 130B2, as shown in FIG. 2B. In some embodiments, the thickness T8 of the outer part 130B2 outside the interspace 140 is greater than the thickness T9 of the inner part 130B1 on the inner sidewalls 102a and 102b of the fins 102A and 102B in the interspace 140, as shown in FIG. 2B. In some embodiments, the ratio (T8/T9) of the thickness T8 to the thickness T9 is about greater than 1. In some embodiments, the ratio (T8/T9) of the thickness T8 to the thickness T9 is about 1.1 to about 3. With the abovementioned ratio (T8/T9) of the thickness T8 to the thickness T9, in accordance with some embodiments, an inner spacer structure and outer spacers having different thicknesses can be formed in subsequent processes, and the details will be discussed hereinafter.

In some embodiments, the dielectric material 130 is merged above the interspace 140 between the fin 102A and the fin 102B, as shown in FIG. 2B. In some embodiments, the dielectric material 130 is merged above the interspace 140 so as to form an air gap 170 located between the dielectric material 130, the fin 102A, and the fin 102B, as shown in FIG. 2B. In some embodiments, the air gap 170 is located in the interspace 140. The dielectric material 120 and the dielectric material 130 in combination form a dielectric structure over the semiconductor substrate 100 and in the interspace 140 between the fin 102A and the fin 102B, as shown in FIG. 2B, in accordance with some embodiments. In some embodiments, the air gap 170 is within the dielectric structure, as shown in FIG. 2B.

In some embodiments, an outer portion of the dielectric structure is on the outer sidewalls 102c and 102d of the fins 102A and 102B. In some embodiments, the thickness of the outer portion (e.g., the sum of the thickness T2 of the dielectric material 120 and the thickness T8 of the outer part 130B2 of the dielectric material 130) is within a range of about 8 nm to about 15 nm. In some embodiments, an inner portion of the dielectric structure is on the inner sidewalls 102a and 102b of the fins 102A and 102B. In some embodiments, the thickness of the inner portion (e.g., the sum of the thickness T2 of the dielectric material 120 and the thickness T9 of the inner part 130B1 of the dielectric material 130) is within a range of about 3 nm to about 14 nm. When measured along a horizontal line parallel to the top surface of the semiconductor substrate 100, the thickness of the outer portion of the dielectric structure is greater than the thickness of the inner portion of the dielectric structure by about 1 nm to about 5 nm, in accordance with some embodiments. Due to the difference between the thickness of the inner portion of the dielectric structure and the thickness of the outer portion of the dielectric structure, in accordance with some embodiments, an inner spacer structure and outer spacers having different thicknesses can be formed from the dielectric structure by etching in subsequent processes, and the details will be discussed hereinafter.

In some embodiments, a portion 130D of the dielectric material 130 above the gate structures 117 is thicker than a portion 130E of the dielectric material 130 on the sidewalls 117a and 117b of the gate structures 117, as shown in FIG. 3B. In some embodiments, the thickness T10 of the portion 130D over the top surfaces of the gate structures 117 is greater than the thickness T11 of the portion 130E over the dielectric layer 120 between the adjacent gate structures 117. In some embodiments, the ratio (T10/T11) of the thickness T10 to the thickness T11 is about greater than 1. In some embodiments, the ratio (T10/T11) of the thickness T10 to the thickness T11 is about 1.2 to about 5.

In some embodiments, the thickness T11 of the portion 130E of the dielectric material 130 on the sidewalls 117a and 117*b* of the gate structures 117 substantially decreases from the portion 130D downwards to the semiconductor substrate 100, as shown in FIG. 3B. In some embodiments, the distance D2 between the adjacent gate structures 117 is greater than double the sum of the thicknesses of the dielectric material 120 and the dielectric material 130, so that the dielectric material 130 does not merge above the interspace between the adjacent gate structures 117.

Figure 2C:
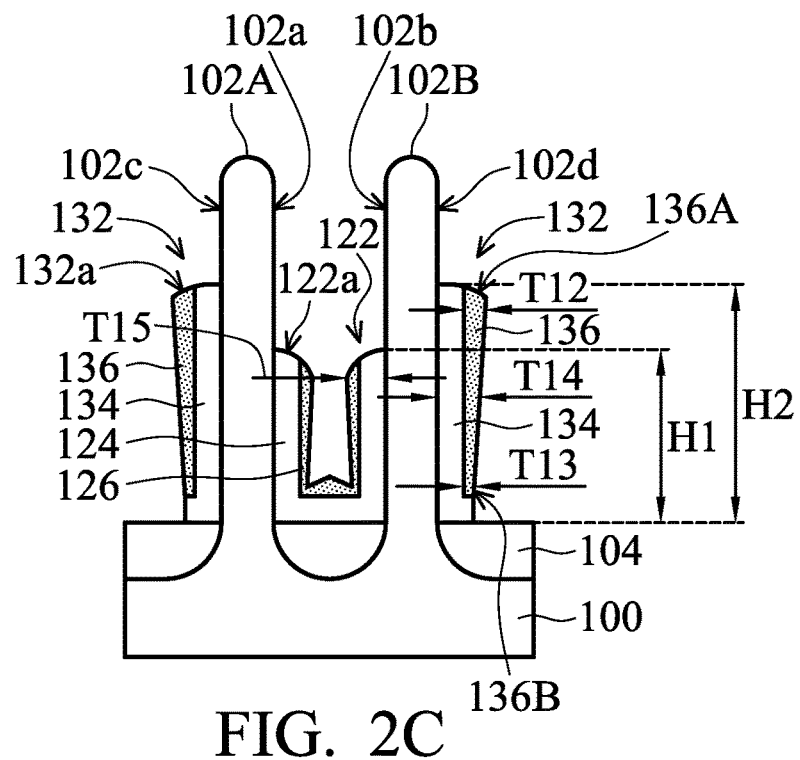

Afterwards, the dielectric structure is partially removed (e.g., by etching), and the top surface 122*a* of a first remaining portion 122 of the dielectric structure in the interspace 140 is lower than the top surface 132*a* of a second remaining portion 132 of the dielectric structure outside the interspace 140, as shown in FIG. 2C, in accordance with some embodiments. It should be noted that in the following paragraphs of the disclosure, the first remaining portion 122 of the dielectric structure may also be referred to as the inner spacer structure 122, and the second remaining portion 132 of the dielectric structure may also be referred to as the outer spacers 132.

In some embodiments, the dielectric structure is partially removed by an etching process. In some embodiments, the etching process includes a dry etching process, a wet etching process, or a combination thereof. In some embodiments, the dielectric structure is partially removed by an anisotropically etching process. In some embodiments, the dielectric structure is partially removed by partially removing the dielectric material 120 and the dielectric material 130 by an anisotropically etching process.

In some embodiments, the dielectric material 120 and the dielectric material 130 are partially removed (e.g., by etching) to form an inner spacer structure 122 between the fin 102A and the fin 102B and outer spacers 132 on two opposite sides of the inner spacer structure 122, as shown in FIG. 2C. In some embodiments, the inner spacer structure 122 is formed on the inner sidewalls 102*a* and 102*b* of the fins 102A and 102B, and the outer spacers 132 are formed on the outer sidewalls 102*c* and 102*d* of the fins 102A and 102B, as shown in FIG. 2C. In some embodiments, the top surface 122*a* of the inner spacer structure 122 is below the top surfaces 132*a* of the outer spacers 132, as shown in FIG. 2C.

In some embodiments, the dielectric material 120 and the dielectric material 130 are etched to expose the fins 102A and 102B, and the upper part 136A of the remaining portion 136 of the dielectric material 130 is thicker than a lower part 136B of the remaining portion 136 of the dielectric material 130, as shown in FIG. 2C. The upper part 136A of the remaining portion 136 of the dielectric material 130 has a thickness T12, and the lower part 136B of the remaining portion 136 of the dielectric material 130 has a thickness T13. In some embodiments, the thickness T12 is greater than the thickness T13. It should be noted that in the following paragraphs of the disclosure, the remaining portion 136 of the dielectric material 130 may also be referred to as the second outer dielectric layer 136 of the outer spacer 132.

In some embodiments, after the portions of the dielectric material 130 above the fins 102A and 102B and the interspace 140 are etched away, the top surface 122*a* of the inner spacer structure 122 is below the top surfaces 132*a* of the outer spacers 132 after the etching process. Therefore, the growth of epitaxial structures outwards along lateral directions can be better restrained and confined by the relatively high outer spacers 132 in subsequent processes, and the details will be discussed hereinafter.

In some embodiments, the height H1 of the inner spacer structure 122 is less than the height H2 of the outer spacers 132, as shown in FIG. 2C. The difference in the height H1 and the height H2 may result from the difference in the deposited amounts of the dielectric material 130 in the interspace 140 and outside the interspace 140. In some embodiments, the height H1 of the inner spacer structure 122 is less than the height H2 of the outer spacers 132 by about 1 nm to about 20 nm. Thus, in subsequent processes for forming an epitaxial structure on the fins 102A and 102B, the growth of the epitaxial structure outwards laterally can be better restrained and confined by the relatively high outer spacers 132. Therefore, the lateral growth of the epitaxial structure on the fins 102A and 102B can be reduced, and the merge window of growths of adjacent epitaxial structures can be enlarged. In addition, with the reduction of the lateral growth of the epitaxial structure, the overlap area between the epitaxial structure and an adjacent metal gate structure can be reduced, the resulting parasitic capacitance can be reduced, and the electrical performance of the semiconductor structure can be improved.

In some embodiments, the thickness T14 of the outer spacers 132 is greater than the thickness T15 of the inner spacer structure 122, as shown in FIG. 2C. Specifically, when measured along a horizontal line parallel to the top surface of the semiconductor substrate 100, the thickness T14 of the outer spacers 132 is greater than the thickness T15 of the inner spacer structure 122, in accordance with some embodiments. The difference in the thickness T14 and the thickness T15 may result from the difference in the thickness T8 of the outer part 130B2 and the thickness T9 of the inner part 130B1 of the dielectric material 130.

In some embodiments, the thickness T14 of the outer spacers 132 is greater than the thickness T15 of the inner spacer structure 122 by about 1 nm to about 5 nm. Accordingly, the dielectric inner spacer structure 122 located between conductive features (e.g., lower portions of an epitaxial structure on the fins 102A and 102B which will be formed subsequently) is relatively thin, and this can result in less undesired parasitic capacitance in the semiconductor structure, so as to improve the electrical properties of the semiconductor structure.

In some embodiments, the thickness T14 of the outer spacers 132 is within a range of about 8 nm to about 15 nm. In some embodiments, the thickness T15 of the inner spacer structure 122 is within a range of about 3 nm to about 14 nm.

In some embodiments, the inner spacer structure 122 includes a first inner dielectric layer 124 and a second inner dielectric layer 126, and the second inner dielectric layer 126 is formed on the first inner dielectric layer 124, as shown in FIG. 2C. In some embodiments, the first inner dielectric layer 124 has a dielectric constant that is lower than that of the second inner dielectric layer 126. Therefore, the second inner dielectric layer 126 having a relatively high dielectric constant can prevent oxygen penetration from an ILD layer to an epitaxial structure that will be formed in subsequent processes, while the first inner dielectric layer 124 having a relatively low dielectric constant can reduce the parasitic capacitance in the semiconductor structure. The details will be discussed hereinafter.

In some embodiments, each of the outer spacers 132 includes a first outer dielectric layer 134 and a second outer dielectric layer 136, and the second outer dielectric layer 136 is formed on the first outer dielectric layer 134, as shown in FIG. 2C. In some embodiments, an upper portion (e.g., the upper part 136A of the remaining portion 136 of the dielectric material 130) of the second outer dielectric layer 136 is thicker than a lower portion (e.g., the lower part 136B of the remaining portion 136 of the dielectric material 130) of the second outer dielectric layer 136.

Figure 3C:
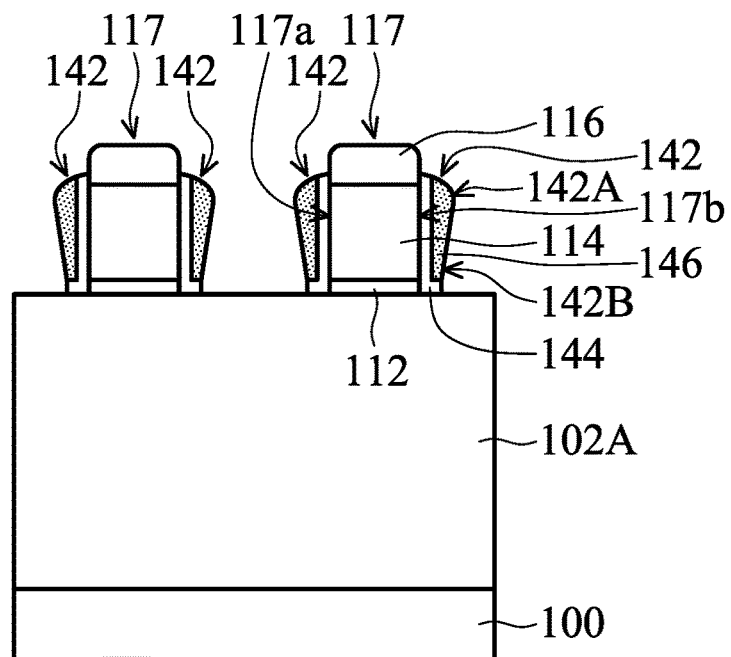

In some embodiments, the dielectric material 120 and the dielectric material 130 are partially removed (e.g., by etching) to form a gate spacer structure 142 on the sidewalls 117a and 117b of each of the gate structures 117, as shown in FIG. 3C. In some embodiments, each of the gate spacer structures 142 has an upper portion 142A protruding outward from the side surface of the gate spacer structure 142, as shown in FIG. 3C. In some embodiments, the upper portion 142A of the gate spacer structure 117 is thicker than a lower portion 142B of the gate spacer structure 142, as shown in FIG. 3C. In some embodiments, the thickness of the gate spacer structure 142 substantially decreases from the upper portion 142A towards the lower portion 142B, as shown in FIG. 3C. In some embodiments, the thickness of the gate spacer structure 142 is within a range of about 8 nm to about 15 nm.

In some embodiments, each of the gate spacer structures 142 includes an inner gate spacer 144 and an outer gate spacer 146, and the outer gate spacer 146 is formed on the inner gate spacer 144, as shown in FIG. 3C. In some embodiments, an upper portion of the outer gate spacer 146 is thicker than a lower portion of the outer gate spacer 146, as shown in FIG. 3C. In some embodiments, the outer gate spacer 146 has a thickness that substantially decreases from the upper portion towards the lower portion, as shown in FIG. 3C.

In some embodiments, the etching process for partially removing the dielectric structure (e.g., the dielectric material 120 and the dielectric material 130) includes a wet etching process. The wet etching process may use a wet etching solution that includes a tetramethylammonium hydroxide (TMAH), a HF/HNO$_3$/CH$_3$COOH solution, one or more other applicable etching solutions, or a combination thereof.

In some embodiments, the etching process for partially removing the dielectric structure (e.g., the dielectric material 120 and the dielectric material 130) includes a dry etching process. In some embodiments, the dry etching process is an anisotropic etching process. In some embodiments, the dry etching process uses dry etchant gasses including one or more of CO, CO$_2$, CH$_3$F, SO$_2$, CH$_4$, Ar, CF$_4$, HBr, O$_2$, NF$_3$, SF$_6$, and He. In some embodiments, the dry etchant gasses include CH$_3$F, O$_2$, and CH$_4$. In some embodiments, the dry etching process is a deep reactive-ion etching (DRIE) process so as to achieve good anisotropic etching effects.

Figure 2D:
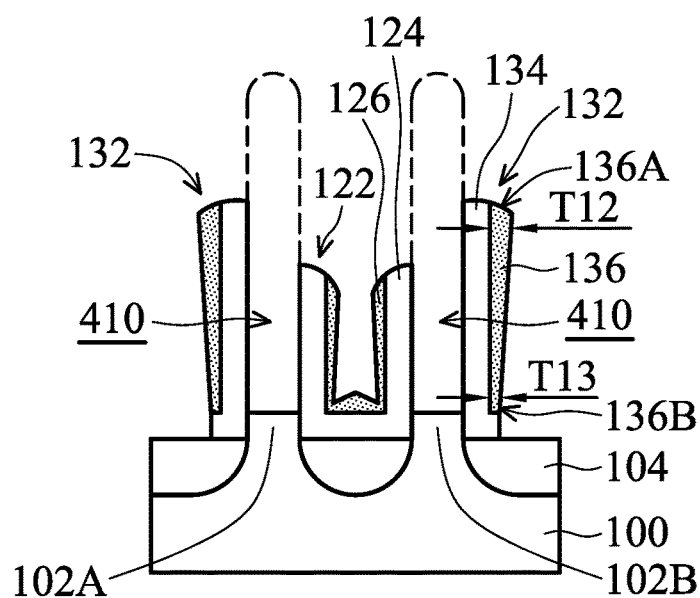
Figure 3D:
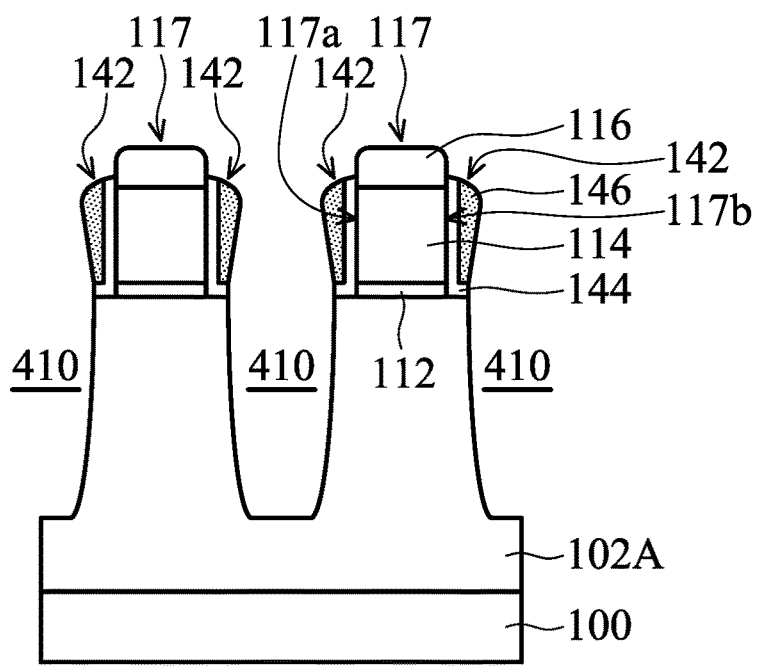

Afterwards, fins 102A and 102B are recessed to form trenches 410, as shown in FIGS. 2D and 3D, in accordance with some embodiments.

In some embodiments, the trenches 410 are formed by recessing (e.g., etching) the fins 102A and 102B to substantially having the same height and the same profile, as shown in FIGS. 2D and 3D. In some embodiments, the top surfaces of the fins 102A and 102B are etched such that they are above the top surface of the isolation feature 104, as shown in FIGS. 2D and 3D. In some embodiments, the sidewalls of each of the trenches 410 are substantially parallel to each other.

In some embodiments, the recessing process for forming the trenches 410 includes an etching process that selectively etches the fins 102A and 102B over other features. The trenches 410 of the fins 102A and 102B may serve as the source/drain regions and may be formed by etching while the channel regions are protected from etching by the gate structures 117. In some embodiments, the etching process includes a dry etching process, a wet etching process, or a combination thereof. In some embodiments, the wet etching process uses an etching solution that includes potassium hydroxide (KOH). In some embodiments, the wet etching process uses an etching solution that includes ammonium hydroxide (NH$_4$OH), hydrogen peroxide (H$_2$O$_2$), sulfuric acid (H$_2$SO$_4$), tetramethylammonium hydroxide (TMAH), one or more other applicable wet etching solutions, or a combination thereof. In some embodiments, the wet etching solution utilizes an NH$_4$OH:H$_2$O$_2$ solution, an NH$_4$OH:H$_2$O$_2$:H$_2$O solution (known as an ammonia-peroxide mixture (APM)), or an H$_2$SO$_4$:H$_2$O$_2$ solution (known as a sulfuric peroxide mixture (SPM)). In some embodiments, the dry etching process uses an etchant gas that includes a fluorine-containing etchant gas (e.g., CF$_4$, SF$_6$, CH$_2$F$_2$, CHF$_3$, and/or C$_2$F$_6$), an oxygen-containing gas, a chlorine-containing gas (e.g., Cl$_2$, CHCl$_3$, CCl$_4$, and/or BCl$_3$), a bromine-containing gas (e.g., HBr and/or CHBR$_3$), an iodine-containing gas, helium, one or more other applicable etchant gases and/or plasmas, or a combination thereof. In some embodiments, the recessing process implements an oxidation process. In some embodiments, the recessing process includes exposing the fins 102A and 102B to an ozone environment to oxidize a portion of the fins 102A and 102B, and subsequently removing the oxidized portion by a cleaning process and/or an etching process.

By controlling factors influencing the recessing process (e.g., the recessing time, the recessing process conditions, and/or other recessing parameters), the profile of the fins 102A and 102B can be modified to meet various design requirements of the final desired semiconductor structure. For example, where the recessing process includes an etching process, various etching parameters may be modified to remove a desired amount of the fins 102A and 102B to achieve a desired profile for the fins 102A and 102B.

Figure 2E:
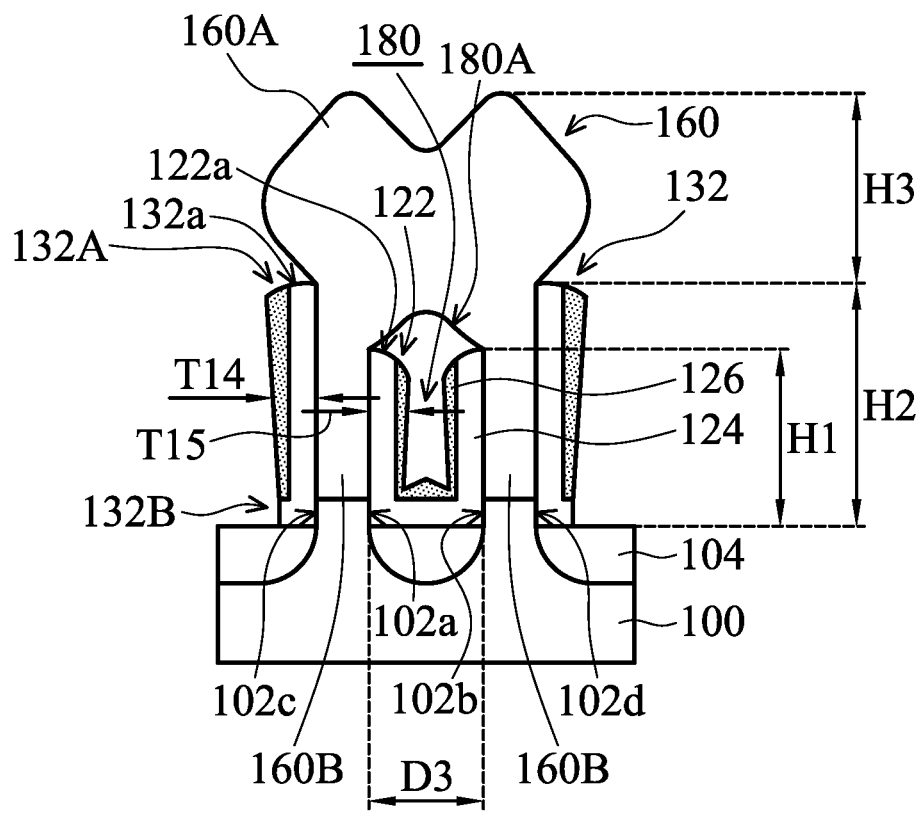
Figure 3E:
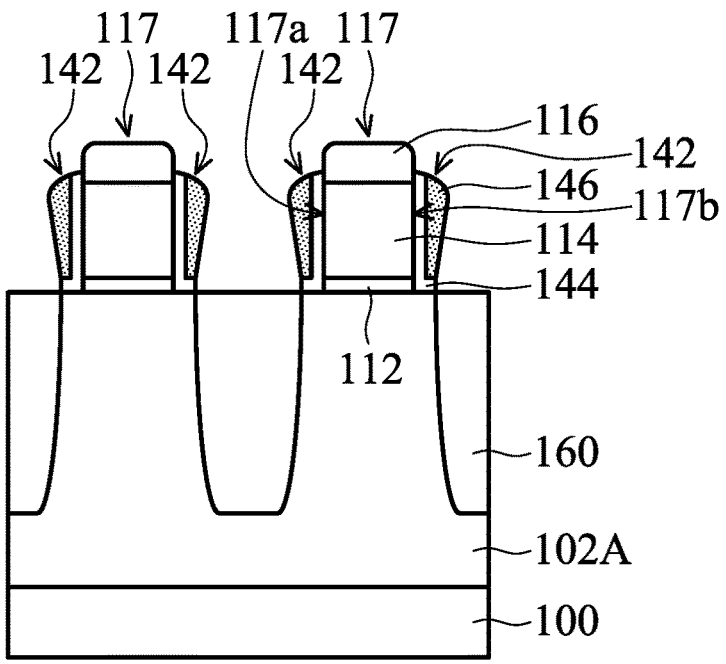

Afterwards, an epitaxial structure 160 is formed on the fins 102A and 102B, as shown in FIGS. 2E and 3E, in accordance with some embodiments. In some embodiments, the epitaxial structure 160 is formed by epitaxially growing a semiconductor material on the exposed surfaces of the recessed fins 102A and 102B. Because the top surface 122a of the inner spacer structure 122 is lower than the top surfaces 132a of the outer spacers 132 located outside the recessed fins 102A and 102B, in accordance with some embodiments, the growth of the epitaxial structure 160 outwards along lateral directions can be better restrained and confined by the relatively high outer spacers 132. Therefore, the lateral growth of the epitaxial structure 160 can be reduced, and the merge window of the epitaxial structure 160 and adjacent epitaxial structures can be enlarged.

The semiconductor material of the epitaxial structure 160 may include a single element semiconductor material, a compound semiconductor material, and/or a semiconductor alloy. The single element semiconductor material may be germanium (Ge) or silicon (Si), the compound semiconductor material may be gallium arsenide (GaAs) or aluminum gallium arsenide (AlGaAs), and the semiconductor alloy may be silicon germanium (SiGe) or gallium arsenide phosphide (GaAsP). In some embodiments, the epitaxial structure 160 includes one or more applicable epitaxial (EPI) layers. For example, the epitaxial structure 160 may include one, two, three, or four EPI layers. Each EPI layer may be formed by epitaxially growing an epitaxial semiconductor material on the exposed surfaces of the recessed fins 102A and 102B and/or the exposed surfaces of other EPI layers, and the epitaxial materials of the EPI layers may be the same or different from one another.

In some embodiments, the epitaxial structure 160 is a feature in the source/drain regions, and the source/drain regions including the epitaxial structures 160 are referred to as epitaxial source/drain features. In some embodiments, the epitaxial structure 160 includes various dopants. In some embodiments, where an NMOS FinFET device is desired, the epitaxial structure 160 includes one or more EPI layers of silicon (epi Si) or silicon carbon, where the silicon or silicon carbon is doped with an n-type dopant such as arsenic, phosphorus, one or more other n-type dopants, or a combination thereof. In some other embodiments, where a PMOS FinFET device is desired, the epitaxial structure 160 includes one or more EPI layers of silicon germanium (epi SiGe), where the silicon germanium is doped with a p-type dopant such as boron, germanium, indium, one or more other p-type dopants, or a combination thereof. The EPI layers of the epitaxial structure 160 may include different dopants or different concentrations of the same dopant.

Any applicable process (e.g., an ion implantation process, a diffusion process, an in-situ doping process, or a combination thereof) may be implemented for doping the epitaxial semiconductor material deposited over the recessed fins 102A and 102B. A selective epitaxial growth (SEG) process may be performed to grow an EPI layer of semiconductor material on the recessed fins 102A and 102B, where dopants may be introduced into the semiconductor material during the SEG process (e.g., by adding dopants to a source material of the SEG process) to form a doped EPI layer. The SEG process may be performed by any applicable deposition technique, such as CVD, PVD, ALD, HDP-CVD, MO-CVD, RP-CVD, PE-CVD, low-pressure CVD (LP-CVD), atomic layer CVD (AL-CVD), atmospheric pressure CVD (AP-CVD), vapor-phase epitaxy (VPE), ultra-high vacuum CVD (UHV-CVD), molecular beam epitaxy, one or more other applicable processes, or a combination thereof. The SEG process may use gaseous precursors (e.g., silicon-containing gases, such as $SiH_4$ and/or germanium-containing gases, such as $GeH_4$) and/or liquid precursors, and these precursors may interact with a composition of the fins 102A and 102B to form EPI Si or EPI SiGe layers. One or more annealing processes may be performed to activate the epitaxial structure 160. The annealing processes may include rapid thermal annealing (RTA), laser annealing processes, one or more other applicable annealing processes, or a combination thereof.

During the formation of the semiconductor materials of the epitaxial structure 160, an air gap 180 is formed within the epitaxial structure 160 and between the outer spacers 132, as shown in FIG. 2E, in accordance with some embodiments. In some embodiments, the outer spacers 132 are located on two opposite sides of the epitaxial structure 160, as shown in FIG. 2E. In some embodiments, the air gap 180 is formed within the epitaxial structure 160 and the inner spacer structure 122, as shown in FIG. 2E. In some embodiments, the top surface 180A of the air gap 180 within the epitaxial structure 160 is below the top surfaces 132a of the outer spacers 132, as shown in FIG. 2E.

However, embodiments of the disclosure have many variations and/or modifications. In some other embodiments, the top surface 180A of the air gap 180 within the epitaxial structure 160 is above or substantially level with the top surfaces 132a of the outer spacers 132 (not shown).

In some embodiments, the epitaxial structure 160 has an upper portion 160A having a height H3 starting from the top surface 132a of the outer spacer 132 and ending at the topmost surface of the epitaxial structure 160, as shown in FIG. 2E. In some embodiments, the ratio (H3/(H2−H1)) of the height H3 to the difference between the height H2 of the outer spacers 132 and the height H1 of the inner spacer structure (H2−H1) is within a range of about 1 to about 2. In some embodiments, while the lateral growth of the epitaxial structure 160 along with the lateral dimension of the epitaxial structure 160 is reduced due to the relatively high outer spacers 132, the specific ratio (H3/(H2−H1)) provides an optimized design of the volume and the shape of the epitaxial structure 160. Therefore, an improved conductive performance of the epitaxial structure 160 can be provided.

In some embodiments, the first outer dielectric layer 134 of each of the outer spacers 132 is disposed along the outer sidewall of the epitaxial structure 160, as shown in FIG. 2E. The epitaxial structure 160 has lower portions 160B on the fins 102A and 102B. In some embodiments, the first outer dielectric layers 134 of the outer spacers 132 are on the outer sidewalls of the lower portions 160B of the epitaxial structure 160, as shown in FIG. 2E.

In some embodiments, the first inner dielectric layer 124 and the second inner dielectric layer 126 of the inner spacer structure 122 are between the lower portions 160B of the epitaxial structure 160, as shown in FIG. 2E. In some embodiments, the first inner dielectric layer 124 is on the sidewalls of the air gap 180 within the epitaxial structure 160. In some embodiments, the second inner dielectric layer 126 is on the first inner dielectric layer 124 and between the lower portions 160B of the epitaxial structure 160.

The lower portions 160B of the epitaxial structure 160 are separated by a distance D3. In some embodiments, the distance D3 is within a range of about 8 nm to about 30 nm. In some embodiments, the ratio (T15/D3) of the thickness T15 of the inner spacer structure 122 to the distance D3 is less than about 0.45. In some embodiments, the ratio (T15/D3) of the thickness T15 to the distance D3 is within a range of about 0.1 to about 0.4. Since the dielectric constant of the air gap 180 is relatively low (e.g., about 1), and the inner spacer structure 122 and the air gap 180 are considered as dielectric medium which is located between the lower portions 160B of the epitaxial structure 160. Therefore, the above ratio (T15/D3) of the thickness T15 to the distance D3 in accordance with some embodiments may be advantageous to minimize the parasitic capacitance resulted from the lower portions 160B and the dielectric medium located between the lower portions 160B.

Figure 2F:
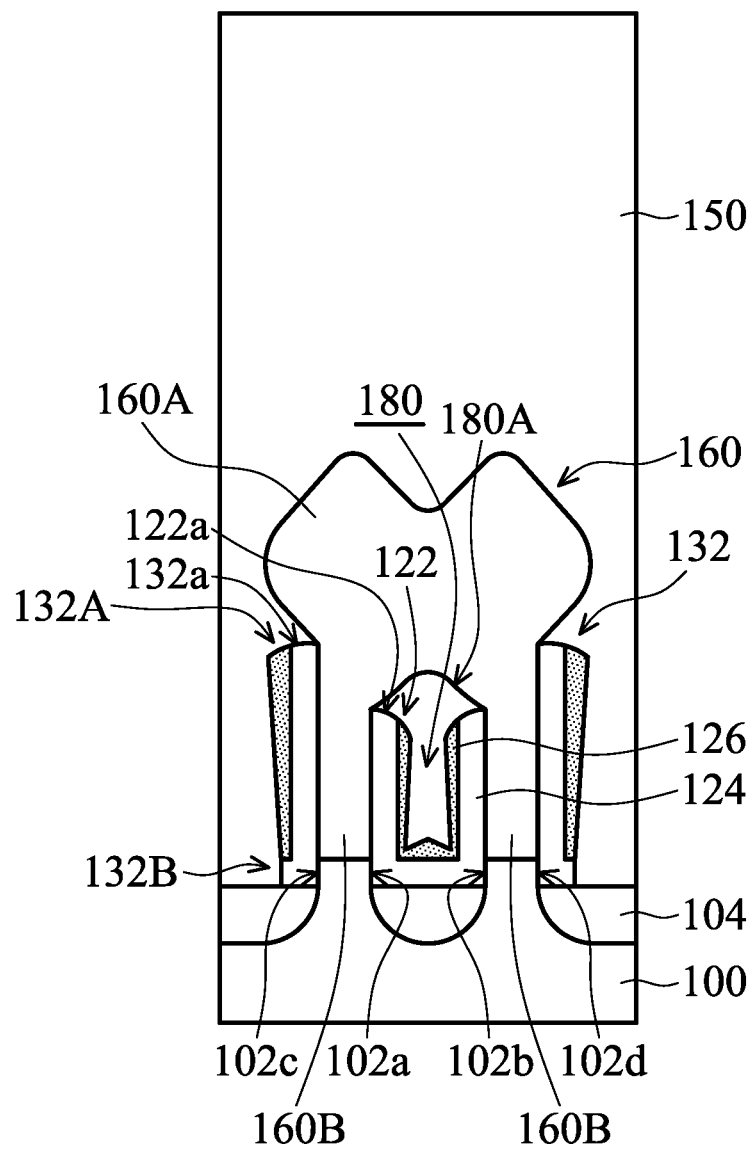
Figure 3F:
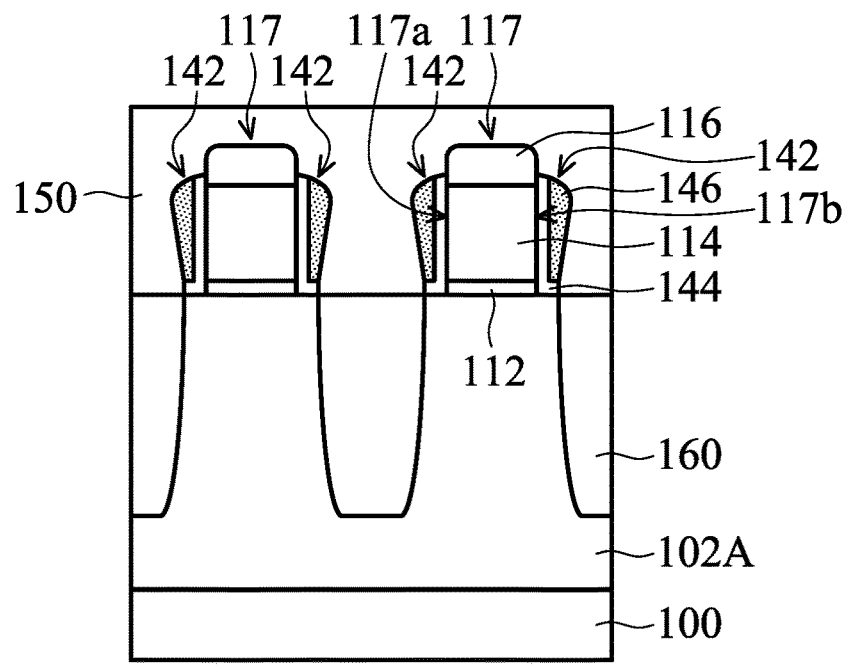

Afterwards, a dielectric material layer 150 is deposited over the epitaxial structures 106, the isolation feature 104, and the gate structures 117, as shown in FIGS. 2F and 3F, in accordance with some embodiments. The dielectric material layer 150 may be made of silicon oxide, silicon oxynitride, borosilicate glass (BSG), phosphoric silicate glass (PSG), borophosphosilicate glass (BPSG), fluorinated silicate glass (FSG), a low-k material, a porous dielectric material, one or more other applicable dielectric materials, or a combination thereof. The dielectric material layer 150 may be deposited using a CVD process, an ALD process, a PVD process, a spin-on process, one or more other applicable processes, or a combination thereof.

Figure 2G:
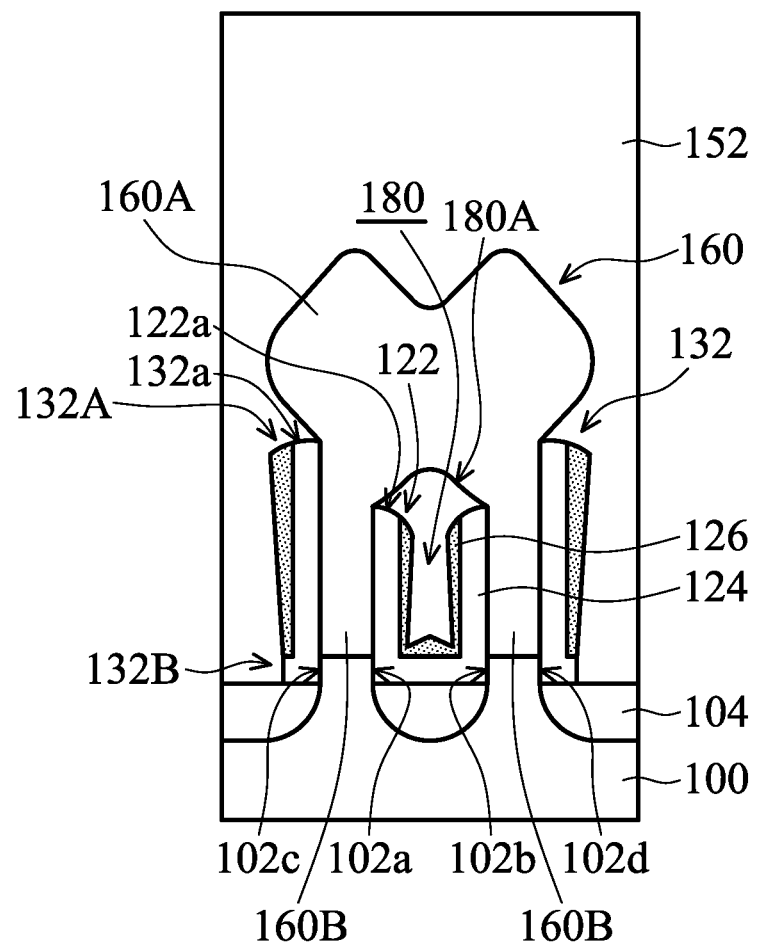
Figure 3G:
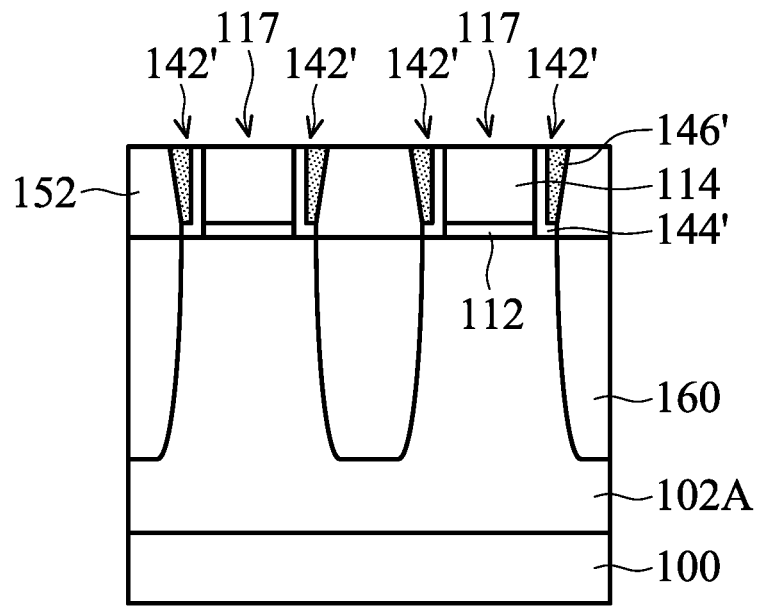

Afterwards, the dielectric material layer 150 is thinned until the gate structures 117 are exposed, as shown in FIGS. 2G and 3G, in accordance with some embodiments. In some embodiments, the dielectric material layer 150 is thinned until the hard mask layers 116 used for defining the gate structures 117 are exposed. After the thinning process of the dielectric material layer 150, the remaining portion of the dielectric material layer 150 forms the dielectric layer 152 over the semiconductor substrate 100, as shown in FIGS. 2G and 3G, in accordance with some embodiments. In some embodiments, the dielectric layer 152 covers the epitaxial structure 106 and surrounds the gate structures 117.

In some embodiments, during the thinning process, the gate spacer structures 142 are thinned, and the top surfaces of the thinned gate spacer structures 142' are substantially coplanar with the top surface of the dielectric layer 152, as shown in FIG. 3G. In some embodiments, the inner gate spacers 144 and the outer gate spacers 146 are thinned, so that the top surfaces of the thinned inner gate spacers 144' and the top surfaces of the thinned outer gate spacers 146' are substantially level with the top surface of the dielectric layer 152, as shown in FIG. 3G.

Figure 3H:
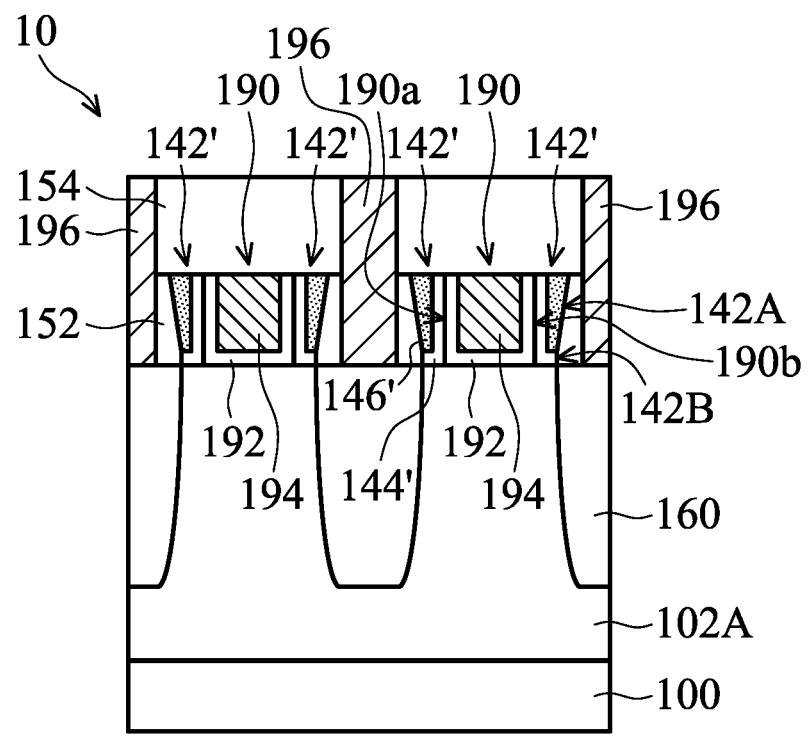

Afterwards, a gate replacement process is performed, as shown in FIG. 3H, in accordance with some embodiments. In some embodiments, the gate electrode layers 114 of the gate structures 117 are removed to form trenches, and then metal gate structures 190 are formed in the trenches. In some embodiments, each of the metal gate structures 190 includes a high-k gate dielectric layer 192 and a metal layer 194 on the high-k dielectric layer 192. The metal layer 194 may serve as a metal electrode and include a work function layer and a metal filling surrounded by the work function layer. In some embodiments, the dielectric layer 152 serves as an interlayer dielectric (ILD) and surrounds the metal gate structures 190, and the top surface of the dielectric layer 152 is substantially level with the top surface of the metal layer 192 and the top surface of the high-k dielectric layer 194, as shown in FIG. 3H.

Figure 2H:
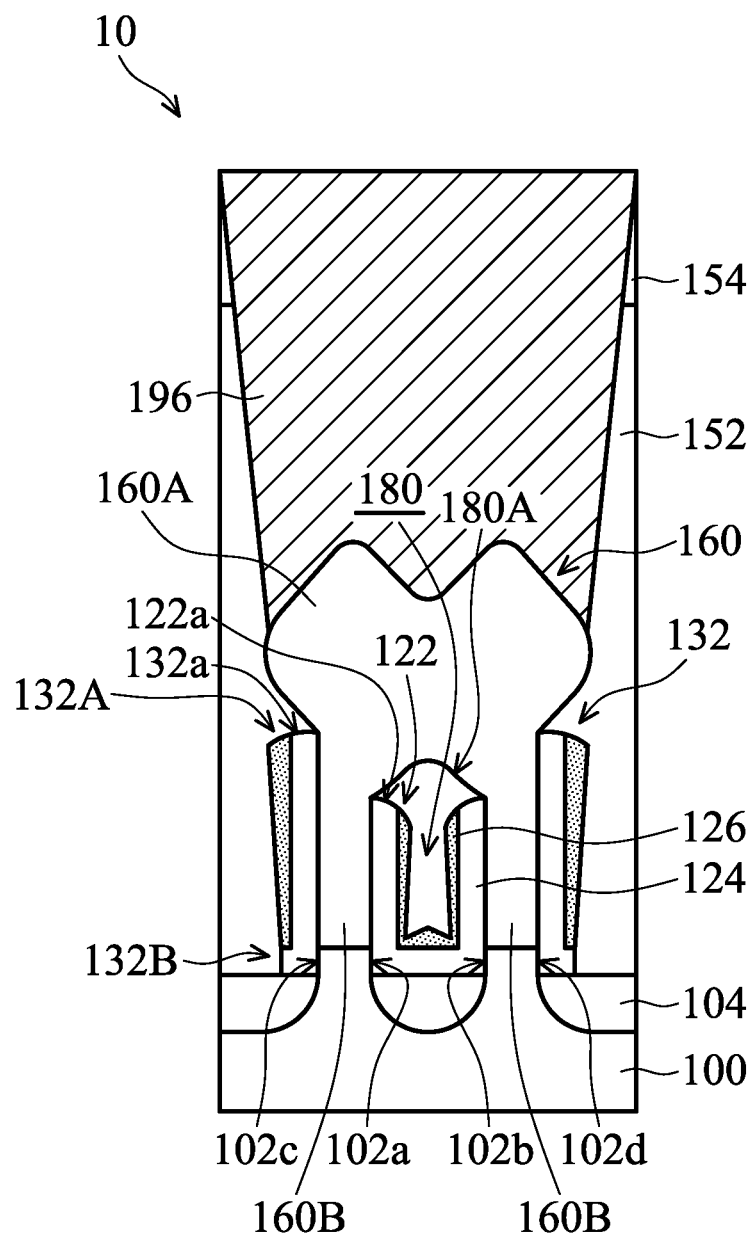

Afterwards, a dielectric layer 154 is deposited over the dielectric layer 152 and the metal gate structures 190, as shown in FIGS. 2H and 3H, in accordance with some embodiments. In some embodiments, the dielectric layer 154 is formed so as to cover the metal layers 194 and the epitaxial structures 160. The material and the formation method of the dielectric layer 154 may be the same as or similar to those of the dielectric layer 152.

Afterwards, openings are formed to expose the top surfaces of the epitaxial structures 160, as shown in FIGS. 2H and 3H, in accordance with some embodiments. Openings may also be formed to expose the top surfaces the metal gate structures 190. The formation of the openings may involve one or more photolithography processes and one or more etching processes. Then, one or more conductive materials may be filled in the openings to form contact structures 196. Therefore, in some embodiments, the semiconductor structure 10 as shown in FIGS. 2H and 3H is formed. One or more conductive materials may also be filled in the openings which expose the top surfaces of the metal gate structures 190 to form additional contact structures. The conductive materials may include aluminum, aluminum alloy (e.g., aluminum/silicon/copper alloy), copper, copper alloy, titanium, titanium nitride, tantalum, tantalum nitride, tungsten, polysilicon, metal silicides, one or more other applicable metals, or a combination thereof. The metal silicides may include nickel silicide, cobalt silicide, tungsten silicide, tantalum silicide, titanium silicide, platinum silicide, erbium silicide, palladium silicide, one or more other metal silicides, or a combination thereof.

Figure 4:
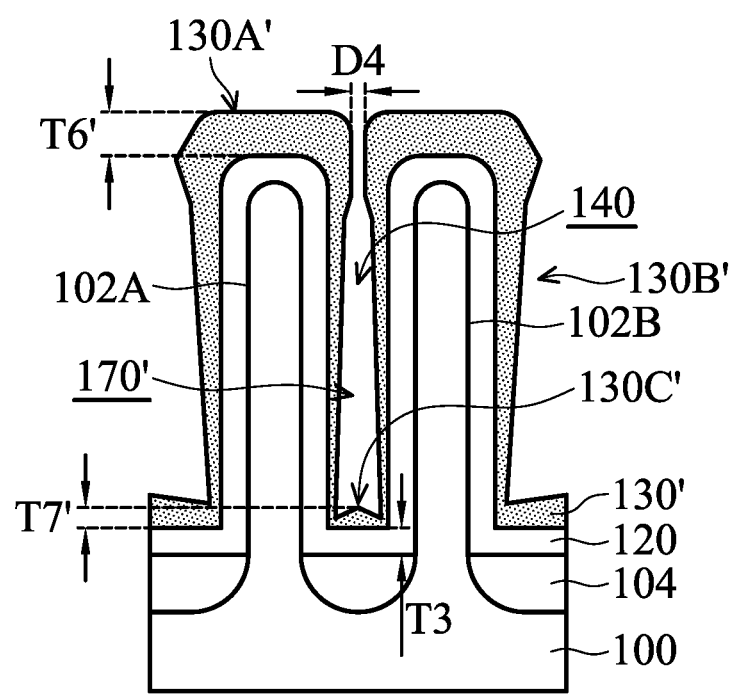
FIG. 4 is a cross-sectional view of a stage of a process for forming a semiconductor structure, in accordance with some embodiments.

Many variations and/or modifications can be made to embodiments of the disclosure. FIG. 4 is a cross-sectional view of a stage of a process for forming a semiconductor structure, in accordance with some embodiments. In some embodiments, after the dielectric material 120 is formed as shown in FIGS. 2A and 3A, the dielectric material 130' is formed over the dielectric material 120 and above the interspace 140 between the fin 102A and the fin 102B, as shown in FIG. 4. In some embodiments, the top portion 130A' of the dielectric material 130' over the fin 102A and another top portion 130A' of the dielectric material 130' over the fin 102B are separated by a distance D4, as shown in FIG. 4. In some embodiments, the distance D4 is in a range of less than about 3 nm.

Similarly, in some embodiments, the thickness T6' of the top portion 130A' over the upper portions of the fins 102A and 102B is greater than the thickness T7' of the bottom portion 130C' over the dielectric layer 120 in the interspace 140, as shown in FIG. 4. In some embodiments, the side portion 130B' has a thickness that substantially decreases from the top portion 130A' towards the bottom portion 130C'. In some embodiments, the air gap 170' is located in the interspace 140 and surrounded by the dielectric layer 130'.

Afterwards, the dielectric material 120 and the dielectric material 130' are partially removed to form the inner spacer structure 122 and the outer spacers 132 by processes similar to those illustrated in FIGS. 2C and 3C, in accordance with some embodiments. Due to the relatively small distance D4 between the separated top portions 130A' over the fins 102A and 102B, the dielectric material 130' piled-up above the interspace 140 can still result in different deposited amounts of the dielectric material 130 in the interspace 140 and outside the interspace 140. Similarly, the relatively high outer spacers 132 are formed, in accordance with some embodiments. Then, processes similar to those illustrated in FIGS. 2D to 2H and FIGS. 3D and 3H are performed to form a semiconductor structure, in accordance with some embodiments.

Figure 5:
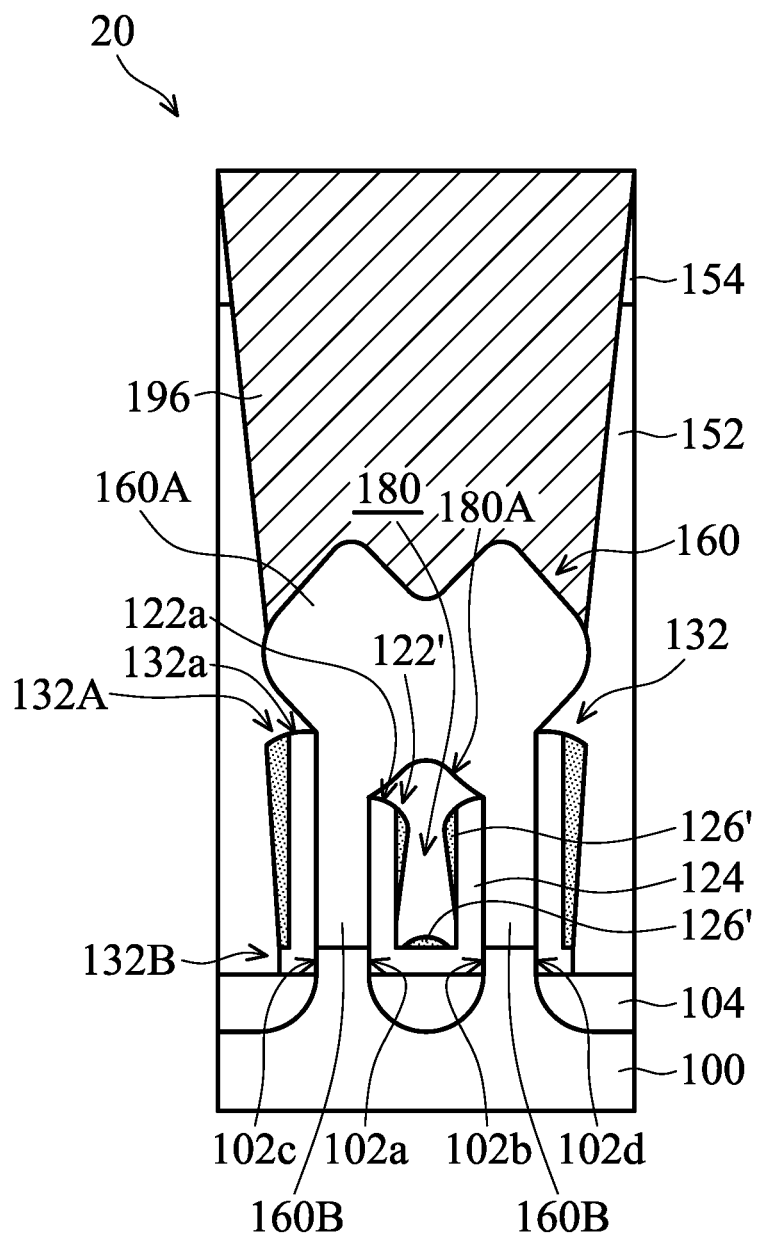
FIG. 5 is a cross-sectional view of a semiconductor structure, in accordance with some embodiments.

Many variations and/or modifications can be made to embodiments of the disclosure. FIG. 5 is a cross-sectional view of a semiconductor structure 20, in accordance with some embodiments. In some embodiments, in the semiconductor structure 20, the second inner dielectric layer 126' is formed on the first inner dielectric layer 124 and exposes a portion of the first inner dielectric layer 124, as shown in FIG. 5.

In some embodiments, the dielectric material 120 is formed as shown in FIGS. 2A and 3A. Then, in some embodiments, the dielectric material 130 is formed over the dielectric material 120 and above the interspace 140 between the fin 102A and the fin 102B by processes similar to those illustrated in FIGS. 2B and 3B or FIG. 4.

In some embodiments, after the dielectric material 120 is formed and during the formation of the dielectric material 130, the dielectric material 120 located in the interspace 140 is not fully covered by the dielectric material 130. In some embodiments, the dielectric material 130 formed on the dielectric material 120 exposes a portion of the dielectric material 120 in the interspace 140.

Then, in some embodiments, the dielectric material 120 and the dielectric material 130 are partially removed by processes similar to those illustrated in FIGS. 2C and 3C. In some embodiments, the dielectric material 120 and the dielectric material 130 are anisotropically etched to expose a portion of the dielectric material 120 in the interspace 140. In some embodiments, after the dielectric material 120 and the dielectric material 130 are partially removed, the inner spacer structure 122' including the first inner dielectric layer 124 and the second inner dielectric layer 126' and the outer spacers 132 (please refer to FIG. 5) are formed. In some embodiments, after the dielectric material 120 and the dielectric material 130 are partially removed, the portion of the dielectric material 120 remains exposed from the partially removed dielectric material 130, and a portion of the partially removed dielectric material 130 in the interspace 140 forms the second inner dielectric layer 126'.

Afterwards, processes similar to those illustrated in FIGS. 2D to 2H and FIGS. 3D and 3H are performed to form the semiconductor structure 20, in accordance with some embodiments. Thus, in some embodiments, the amount of the second inner dielectric layer 126' is reduced, which results in the reduction of the amount of the inner spacer structure 122' remained between the lower portions 160B of the epitaxial structure 160, and the volume of the air gap 180 is relatively increased, as shown in FIG. 5. Therefore, the parasitic capacitance resulting from the dielectric medium (e.g., the inner spacer structure 122' and the air gap 180) located between the lower portions 160B of the epitaxial structure 160 is further reduced.

Figure 6:
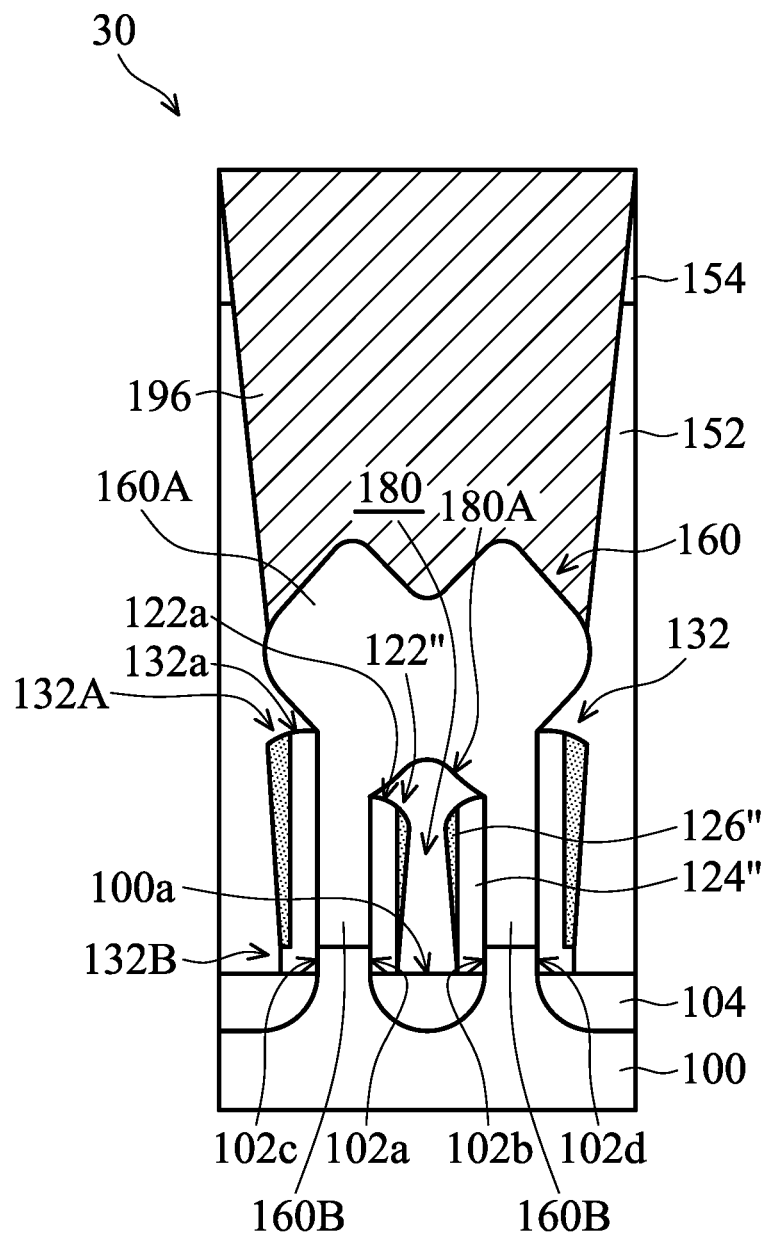
FIG. 6 is a cross-sectional view of a semiconductor structure, in accordance with some embodiments.

Many variations and/or modifications can be made to embodiments of the disclosure. FIG. 6 is a cross-sectional view of a semiconductor structure 30, in accordance with some embodiments. In some embodiments, in the semiconductor structure 30, the top surface 100a of the semiconductor substrate 100 in the air gap 180 is exposed to the air gap 180, as shown in FIG. 6. In some embodiments, the top surface of the isolation feature 104 between the recessed fin 102A and the recessed fin 102B is exposed to the air gap 180, as shown in FIG. 6. Therefore, the volume of the air gap 180 can be relatively increased.

In some embodiments, the dielectric material 130 is formed over the dielectric material 120 and above the interspace 140 between the fin 102A and the fin 102B by processes similar to those illustrated in FIGS. 2B and 3B or FIG. 4. Then, in some embodiments, the dielectric material 120 and the dielectric material 130 are anisotropically etched to expose the fin 102A, the fin 102B, and the top surface 100a of the semiconductor substrate 100 between the fin 102A and the fin 102B to form the inner spacer structure 122" and the outer spacers 132. Afterwards, processes similar to those illustrated in FIGS. 2D to 2H and FIGS. 3D and 3H are performed to form the semiconductor structure 30 as shown in FIG. 6, in accordance with some embodiments. In some embodiments, the first inner dielectric layer 124" and the second inner dielectric layer 126" of the inner spacer structure 122" are located on the sidewalls of the lower portions 160B of the epitaxial structure 160. Similarly, the volume of the air gap 180 is relatively increased, thus the parasitic capacitance resulting from the dielectric medium (e.g., the inner spacer structure 122" and the air gap 180) located between the lower portions 160B of the epitaxial structure 160 is further reduced.

Figure 7:
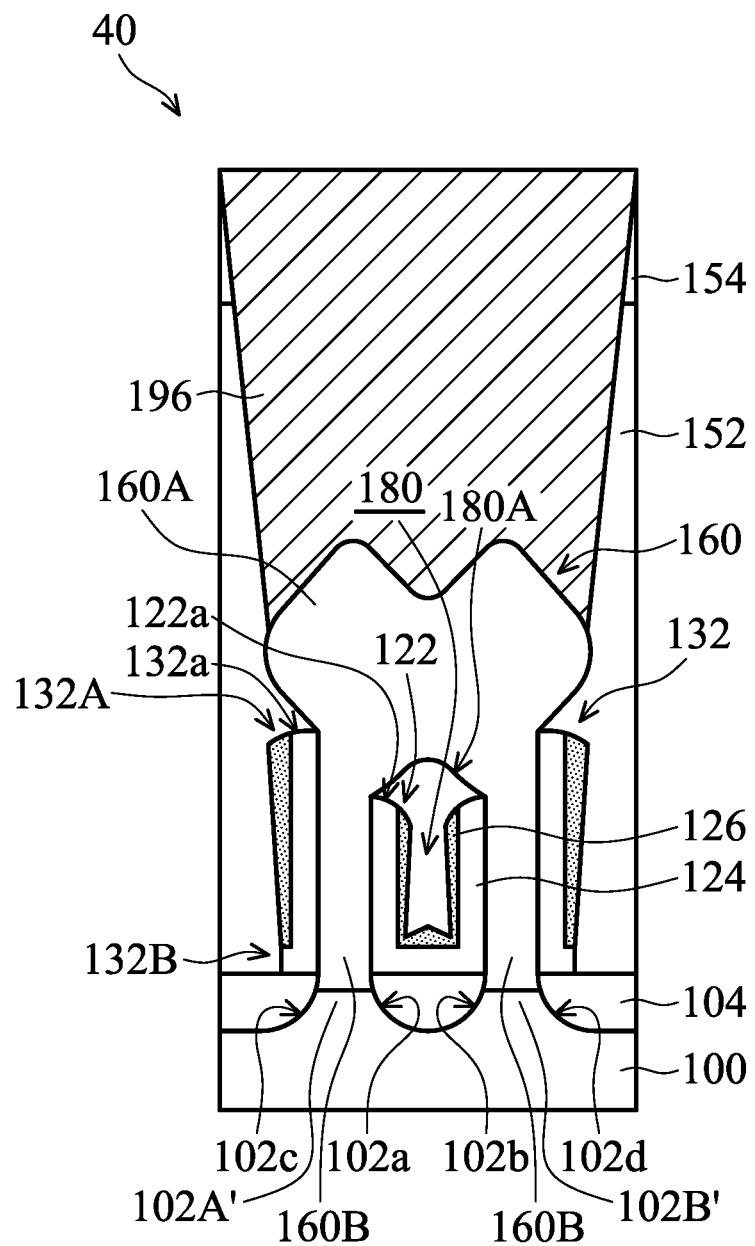
FIG. 7 is a cross-sectional view of a semiconductor structure, in accordance with some embodiments.

Many variations and/or modifications can be made to embodiments of the disclosure. FIG. 7 is a cross-sectional view of a semiconductor structure 40, in accordance with some embodiments. In some embodiments, after the inner spacer structure 122 and the outer spacers 132 are formed as illustrated in FIGS. 2C and 3C, the top surfaces of the fins 102A and 102B are etched, such that the top surfaces of the fins 102A' and 102B' are below the top surface of the isolation feature 104, as shown in FIG. 7. In some embodiments, the top surfaces of the fins 102A' and 102B' are below the bottom surfaces of the inner spacer structure 122 and the outer spacers 132.

As described previously, the dielectric material 120 and the dielectric material 130 are partially removed to form the inner spacer structure 122 between the fins 102A and 102B and outer spacers 132 on two opposite sides of the inner spacer structure 122. The top surface 122a of the inner spacer structure 122 is below the top surfaces 132a of the outer spacers 132. The relatively high outer spacers 132 may be used to retrain and confine the growth of the epitaxial structure 160 outwards along lateral directions in subsequent processes, so that the lateral growth along the lateral dimension of the epitaxial structure 160 can be reduced. In addition, with the reduction of the lateral growth of the epitaxial structure 160, the merge window of growths of adjacent epitaxial structures 160 in the epitaxial growth process can be enlarged.

Moreover, the thickness T14 of the outer spacers 132 is greater than the thickness T15 of the inner spacer structure 122. The relatively thin dielectric inner spacer structure 122 located between the lower portions 160B of the epitaxial structure 160 on the fins 102A and 102B can result in less undesired parasitic capacitance in the semiconductor structure, so as to improve the electrical properties of the semiconductor structure.

Embodiments for forming a semiconductor structure are provided. The method for forming the semiconductor structure may include forming a first fin and a second fin on a semiconductor substrate, and forming a first dielectric material and a second dielectric material over the first dielectric material and above the interspace between a first fin and a second fin. The first dielectric material and the second dielectric material are partially removed to form an inner spacer structure between the first fin and the second fin and outer spacers on two opposite sides of the inner spacer structure, and the top surface of the inner spacer structure is below the top surfaces of the outer spacers. An epitaxial structure is formed on the first fin and the second fin and between the inner spacer structure and the outer spacers. The relatively high outer spacers may help to reduce the growth of the epitaxial structure outwards along lateral directions and enlarge the merge window of growths of adjacent epitaxial structures.

In accordance with some embodiments, a semiconductor structure is provided. The semiconductor structure includes a first fin and a second fin on a semiconductor substrate. The semiconductor structure also includes an epitaxial structure on the first fin and the second fin. The semiconductor structure further includes outer spacers on outer sidewalls of the epitaxial structure. In addition, the semiconductor structure includes an inner spacer structure between the first fin and the second fin and covering inner sidewalls of the epitaxial structure. A top surface of the inner spacer structure is exposed to an air gap formed between the epitaxial structure and the inner spacer structure.

In accordance with some embodiments, a semiconductor structure is provided. The semiconductor structure includes a first fin and a second fin on a semiconductor substrate. The semiconductor structure also includes an isolation feature surrounding the first fin and the second fin. The semiconductor structure further includes an epitaxial structure formed on the first fin and the second fin. In addition, the semiconductor structure includes outer spacers on opposite sides of the epitaxial structure. Each of the outer spacers comprises a first outer dielectric layer and a second outer dielectric layer over the first outer dielectric layer. The semiconductor structure also includes an inner spacer structure under the epitaxial structure and between the outer spacers. The inner spacer structure comprises a first inner dielectric layer and a second inner dielectric layer over the first inner dielectric layer, and an air gap abuts the second inner dielectric layer and exposes a top surface of the isolation feature.

In accordance with some embodiments, a semiconductor structure is provided. The semiconductor structure includes a first fin and a second fin on a semiconductor substrate. The semiconductor structure also includes an epitaxial structure formed on the first fin and the second fin. The semiconductor structure further includes outer spacers on opposite sides of the epitaxial structure. In addition, the semiconductor structure includes an inner spacer structure between the first fin and the second fin. The epitaxial structure, opposite sidewalls of the inner spacer structure and a bottom portion of the inner spacer structure connecting the opposite sidewalls of the inner spacer structure enclose an air gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first fin and a second fin on a semiconductor substrate;
an epitaxial structure on the first fin and the second fin;
outer spacers on outer sidewalls of the epitaxial structure; and
an inner spacer structure between the first fin and the second fin and covering inner sidewalls of the epitaxial structure,
wherein a top surface of the inner spacer structure is exposed to an air gap formed between the epitaxial structure and the inner spacer structure, wherein a lateral width of the air gap gradually decreases in a direction from a bottom surface of the inner spacer structure to the top surface of the inner spacer structure.

2. The semiconductor structure as claimed in claim 1, wherein opposite sidewalls of the inner spacer structure covering the inner sidewalls of the epitaxial structure and a bottom of the inner spacer structure connecting the opposite sidewalls of the inner spacer structure forms a U-shape of the inner spacer structure.

3. The semiconductor structure as claimed in claim 1, wherein the inner spacer structure comprises a first inner dielectric layer and a second inner dielectric layer over the first inner dielectric layer, and the first inner dielectric layer and the second inner dielectric layer each has a U-shape under the epitaxial structure.

4. The semiconductor structure as claimed in claim 1, wherein the epitaxial structure laterally extends across the inner spacer structure.

5. The semiconductor structure as claimed in claim 1, further comprising:
an isolation feature over the semiconductor substrate and below the outer spacers and the inner spacer structure.

6. The semiconductor structure as claimed in claim 5, wherein a first interface between the outer spacers and the isolation feature is substantially level with a second interface between the inner spacer structure and the isolation feature.

7. A semiconductor structure, comprising:
a first fin and a second fin on a semiconductor substrate;
an isolation feature surrounding the first fin and the second fin;
an epitaxial structure formed on the first fin and the second fin;
outer spacers on opposite sides of the epitaxial structure, wherein each of the outer spacers comprises a first outer dielectric layer and a second outer dielectric layer over the first outer dielectric layer; and
an inner spacer structure under the epitaxial structure and between the outer spacers, wherein the inner spacer structure comprises a first inner dielectric layer and a second inner dielectric layer over the first inner dielectric layer,
wherein an air gap abuts the second inner dielectric layer and exposes a top surface of the isolation feature, wherein a bottom surface of the second outer dielectric layer is higher than a bottom surface of the second inner dielectric layer.

8. The semiconductor structure as claimed in claim 7, wherein the second inner dielectric layer is in direct contact with the isolation feature.

9. The semiconductor structure as claimed in claim 8, wherein the second outer dielectric layer is separated from the isolation feature.

10. The semiconductor structure as claimed in claim 9, wherein the second inner dielectric layer and the second outer dielectric layer are made of same material.

11. The semiconductor structure as claimed in claim 7, wherein a lateral width of the air gap gradually decreases in a direction from the top surface of the isolation feature to a top surface of the inner spacer structure.

12. The semiconductor structure as claimed in claim 7, wherein a top surface of the second inner dielectric layer is separated from the epitaxial structure by the air gap.

13. The semiconductor structure as claimed in claim 7, wherein a topmost point of the air gap is lower than a topmost surface of the outer spacers.

14. A semiconductor structure, comprising:
a first fin and a second fin on a semiconductor substrate;
an epitaxial structure formed on the first fin and the second fin;
outer spacers on opposite sides of the epitaxial structure; and
an inner spacer structure between the first fin and the second fin, wherein the epitaxial structure, opposite sidewalls of the inner spacer structure and a bottom portion of the inner spacer structure connecting the opposite sidewalls of the inner spacer structure enclose an air gap, wherein the inner spacer structure comprises a first inner dielectric layer and a second inner dielectric layer over the first inner dielectric layer, and the first inner dielectric layer and the second inner dielectric layer each has a U-shape under the epitaxial structure.

15. The semiconductor structure as claimed in claim 14, further comprising:
an isolation feature between the semiconductor substrate and the inner spacer structure and between the semiconductor substrate and the outer spacers.

16. The semiconductor structure as claimed in claim 14, wherein a top surface of the first fin is higher than bottom surfaces of the outer spacers and the inner spacer structure.

17. The semiconductor structure as claimed in claim 14, wherein a top surface of the first fin is lower than bottom surfaces of the outer spacers and the inner spacer structure.

18. The semiconductor structure as claimed in claim 14, wherein an interface between the epitaxial structure and the air gap is lower than a top surface of the outer spacers.

19. The semiconductor structure as claimed in claim 14, wherein a lateral width of an upper portion of the air gap is greater than a lateral width of a lower portion of the air gap.

20. The semiconductor structure as claimed in claim 19, wherein the lateral width of the lower portion of the air gap is greater than a lateral width of a middle portion of the air gap.

* * * * *